United States Patent [19]

Kochel

[11] 4,043,889

[45] Aug. 23, 1977

[54] METHOD OF AND APPARATUS FOR THE RADIO FREQUENCY SPUTTERING OF A THIN FILM

[75] Inventor: Leroy Joseph Kochel, Fridley, Minn.

[73] Assignee: Sperry Rand Corporation, New York, N.Y.

[21] Appl. No.: 646,202

[22] Filed: Jan. 2, 1976

[51] Int. Cl.² .............................................. C23C 15/00
[52] U.S. Cl. ................................ 204/192 R; 204/298
[58] Field of Search ................................ 204/192, 298

[56] References Cited

U.S. PATENT DOCUMENTS

| | | | |
|---|---|---|---|
| 3,423,303 | 1/1969 | Davidse et al. | 204/192 |
| 3,525,680 | 8/1970 | Davidse et al. | 204/192 |
| 3,763,031 | 10/1973 | Scow et al. | 204/298 |
| 3,767,551 | 10/1973 | Lang, Jr. et al. | 204/192 |
| 3,860,507 | 1/1975 | Vossen, Jr. | 204/192 |

FOREIGN PATENT DOCUMENTS

| | | | |
|---|---|---|---|
| 2,422,808 | 11/1975 | Germany | 204/298 |

*Primary Examiner*—John H. Mack
*Assistant Examiner*—Aaron Weisstuch
*Attorney, Agent, or Firm*—Kenneth T. Grace; Thomas J. Nikolai; Marshall M. Truex

[57] ABSTRACT

A method of an apparatus for controlling the deposition of a thin film upon a substrate by a radio frequency (RF) sputtering apparatus is disclosed. The apparatus utilizes the predetermined bias voltage vs. vacuum pressure characteristic of the RF sputtering apparatus to control, by a single pressure controller, both the vacuum pressure and the bias voltage. A substrate tuning bias circuit generates an effective DC bias voltage that is determined by the RF impedance of the substrate holder to ground. Through a voltage level shifting circuit, a detected change in the DC bias voltage, e.g., a decrease, causes the pressure controller to adjust, e.g., increase, the vacuum pressure. The change in the vacuum pressure then produces a corresponding adjustment, e.g., an increase, of the bias voltage to stabilize the bias voltage back at a predetermined level.

8 Claims, 4 Drawing Figures

4,043,889

METHOD OF AND APPARATUS FOR THE RADIO FREQUENCY SPUTTERING OF A THIN FILM

BACKGROUND OF THE INVENTION

In the prior art it is known that an RF sputtering apparatus provides an effective and reliable means for the deposition of a thin film upon a substrate. In the P. D. Davidse et al., U.S. Pat. No. 3,525,680, there is disclosed an RF sputtering apparatus in which the desired electrical potentials at the cathodic target and the anodic substrate holder include establishing the potential bias voltage of the anodic substrate holder at ground potential. In the publication "Control of RF Sputtered Film Properties through Substrate Tuning," J. S. Logan, IBM J. Res. Develop., March, 1970, pp. 172–175, there is disclosed an RF sputtering apparatus in which the desired RF and DC potential difference between the substrate holder (including the deposited thin film) and the plasma within the evacuated environment between the anodic substrate holder and the cathodic target, is achieved by a substrate tuning circuit. Further, it is known that an RF sputtering apparatus has a predetermined bias voltage vs. vacuum pressure characteristic in which a change in vacuum pressure provides a predetermined change in bias voltage. This knowledge has provided methods of controlling the deposition of a thin film by directly controlling both bias voltage and/or the vacuum pressure. The present invention is directed toward a method of and an apparatus for optimizing the control of the deposition of a thin film in an RF sputtering apparatus by the use of minimal electronics and a single, commercially available, pressure controller.

SUMMARY OF THE INVENTION

In the present invention, an RF sputtering apparatus having a predetermined bias voltage vs. vacuum pressure characteristic has coupled to its anodic substrate holder, via conductive cooling tubing, a substrate tuning bias circuit. The substrate tuning bias circuit generates an effective DC bias voltage that is determined by the RF impedance, to ground, of the substrate holder. A bias shifting circuit then shifts the level of the DC bias voltage, e.g., from a negative bias voltage to a positive bias voltage, for generating a shifted DC bias voltage that is, in turn, coupled to a single, commercially available, pressure controller. The configuration is such that a change in the DC bias voltage, e.g., a decrease, causes the pressure controller to provide, via an inert gas source, e.g., of argon, a corresponding change in the vacuum pressure, e.g., an increase, which, via the predetermined bias voltage vs. vacuum pressure characteristic of the RF sputtering apparatus, provides a known corresponding change, e.g., an increase, in the bias voltage such that the bias voltage as determined by the substrate tuning circuit is controlled to stabilize at a predetermined level.

DESCRIPTION OF THE PREFERRED EMBODIMENT

Figure 1:
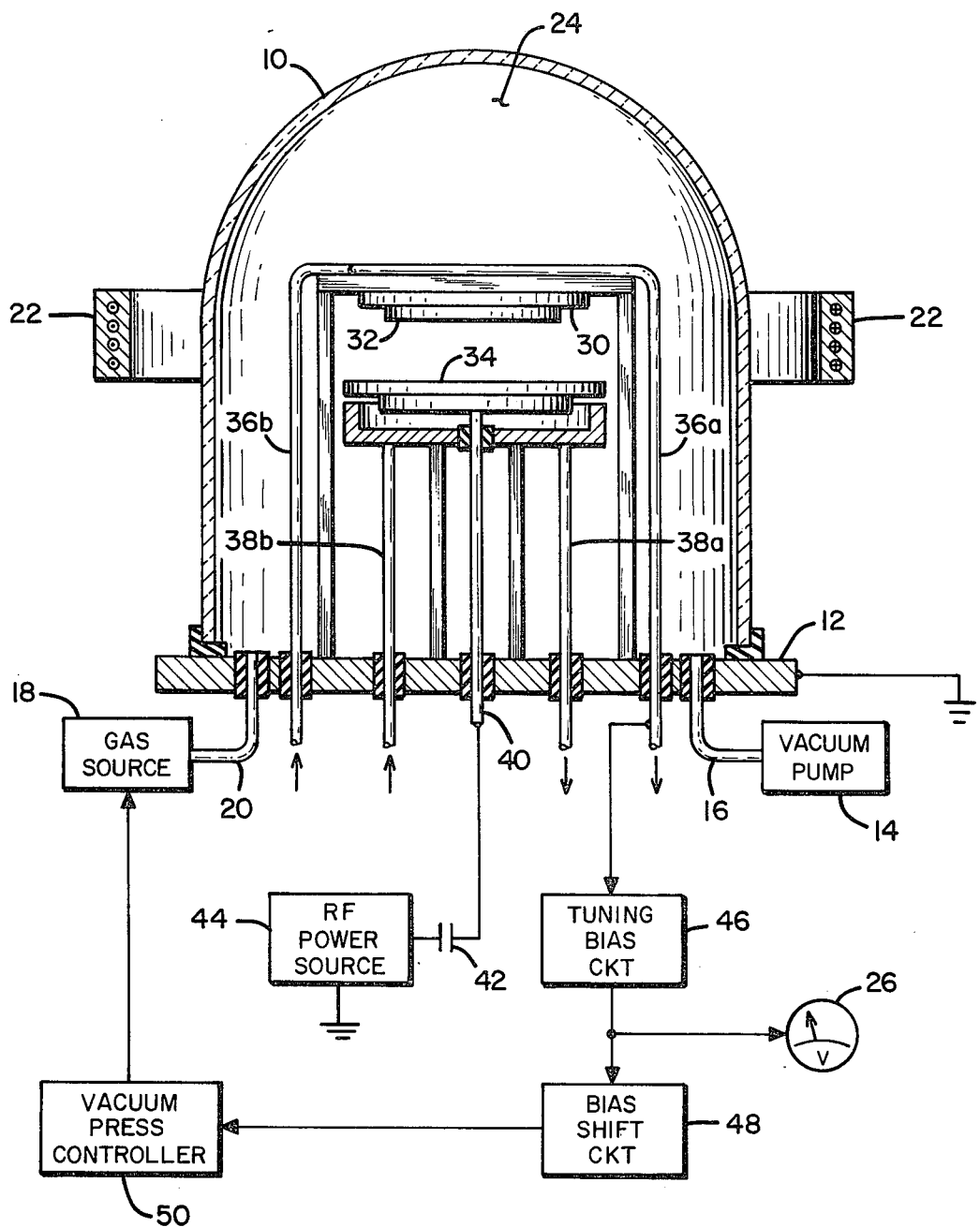
FIG. 1 is a schematic representation of an RF sputtering apparatus in which the present invention is incorporated.

With particular reference to FIG. 1 there is presented a schematic representation of an RF sputtering apparatus into which the present invention is incorporated. The illustrated RF sputtering apparatus includes many known elements including a glass bell jar 10 suitably pressure sealed with and affixed upon metal base 12. Vacuum pump 14, via suitable tubing 16 which insulatively passes through base 12, establishes the evacuated enclosure or environment 24, formed by jar 10 and base 12, at a predetermined vacuum pressure, e.g., $1 \times 10^{-6}$ torr. Additionally, a gas source 18 of a suitable inert gas, e.g., argon, is, via a suitable tubing 20, insulatively coupled through base 12 into the evacuable enclosure 24, while coil 22 provides a magnetic field that is oriented normal to the plane of substrate 32. Under typical operation, vacuum pump 14 is in a continuously operating condition with gas source 18 operated intermittently as required to maintain the evacuable enclosure 24 at the predetermined vacuum pressure. Within the evacuable enclosure 24 there is provided substrate holder 30 for supporting the substrate 32 in a fixed, spaced-apart relationship with the cathodic target 34. Substrate holder 30 and cathodic target 34 have, by suitable tubing 36a, 36b and 38a, 38b, sources of a suitable coolant material coupled thereto for establishing the substrate holder 30 and the cathodic target 34, respectively, at the predetermined and desired temperatures. Conductor 40, which is electrically coupled to cathodic target 34, is, via RF coupling capacitor 42, coupled to RF power source 44 for coupling an RF signal of, e.g., 13.56 megahertz (MHz) to cathodic target 34. Additionally, tubing 36a is utilized to electrically intercouple tuning bias circuit 46 and anodic substrate holder 30. Tuning bias circuit 46 is utilized to generate an effective DC bias voltage that is determined by the RF impedance of substrate holder 30 to ground potential. The DC bias voltage that is generated by substrate tuning bias circuit 46 is, in turn, coupled to a bias shifting circuit 48 that shifts the level of the DC bias voltage, e.g., from a negative bias voltage to a positive bias voltage, for generating a shifted DC bias voltage that is, in turn, coupled to a single, commercially available, pressure controller 50. Pressure vacuum controller 50, being responsively coupled to bias shifting circuit 48, couples to gas source 18 a suitable correcting controlling signal that controls the flow of the inert gas into evacuable enclosure 24, all in response to the changing DC bias voltage generated by substrate tuning bias circuit 46. The change in the vacuum pressure occasioned by the flow of the inert gas from gas source 18 into evacuable enclosure 24 then produces a corresponding change in the bias voltage, thus causing the bias voltage to be stabilized back at its predetermined level, all in accordance with the predetermined bias voltage vs. vacuum pressure characteristic of the RF sputtering apparatus.

Figure 2:
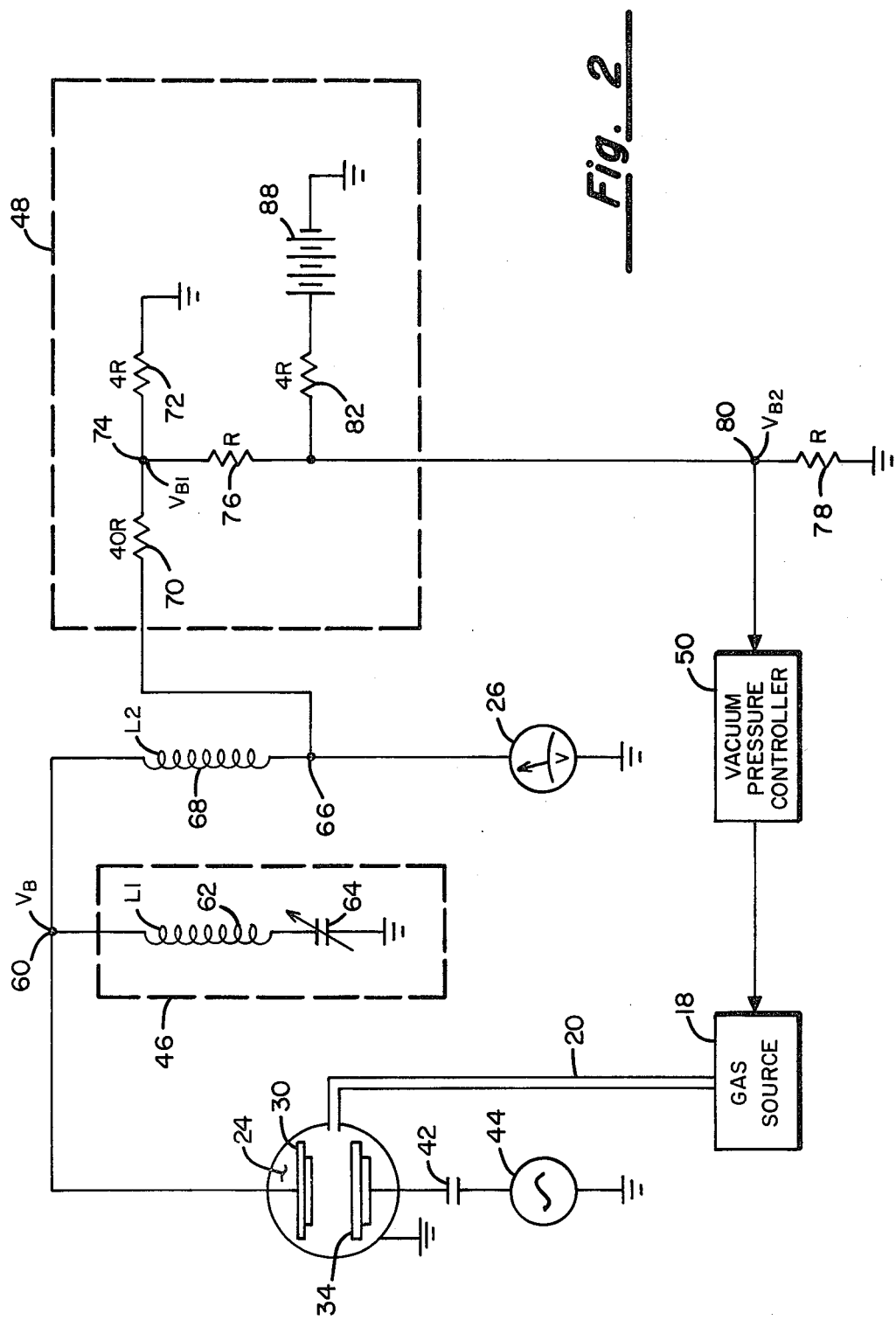
FIG. 2 is a schematic of the circuit that is a preferred embodiment of the present invention.

With particular reference to FIG. 2 there is presented a schematic of the circuit that is a preferred embodiment of the present invention. Substrate tuning bias circuit 46 includes an inductor 62 of, e.g., 3.4 microhenries ($\mu$H), and a serially coupled variable capacitor 64 of 56.0 – 144.0 picofarads (pF), the opposite terminal of which is coupled directly to ground potential. Substrate tuning bias circuit 46, at node 60, generates an effective DC bias voltage $V_B$ that is determined by the RF impedance of the substrate holder 30 to ground potential. This effective DC bias voltage $V_B$ is that effective DC bias voltage at the substrate holder 30 within evacuable enclosure 24 that is the result of the RF signal coupled to target 34 by means of RF power source 44 via RF coupling capacitor 42. This DC bias voltage $V_B$ is then coupled to node 66 via RF choke 68 and thence to voltmeter 26 and bias shifting circuit 48. The DC bias voltage $V_B$ at node 66 is then, via the voltage divider network of resistors 70, 72 at node 74, reduced by the ratio of $R_{72}/(R_{70} + R_{72})$.

This reduced DC bias voltage $V_{B1}$ at node 74 is then, via resistors 76 and 78 and resistor 82 and voltage source 88 at node 80, shifted a predetermined and fixed magnitude that controls vacuum pressure controller 50 to couple to gas source 18 the proper control signal that selectively meters the inert gas into the evacuable enclosure 24 via tubing 20.

Figure 3:
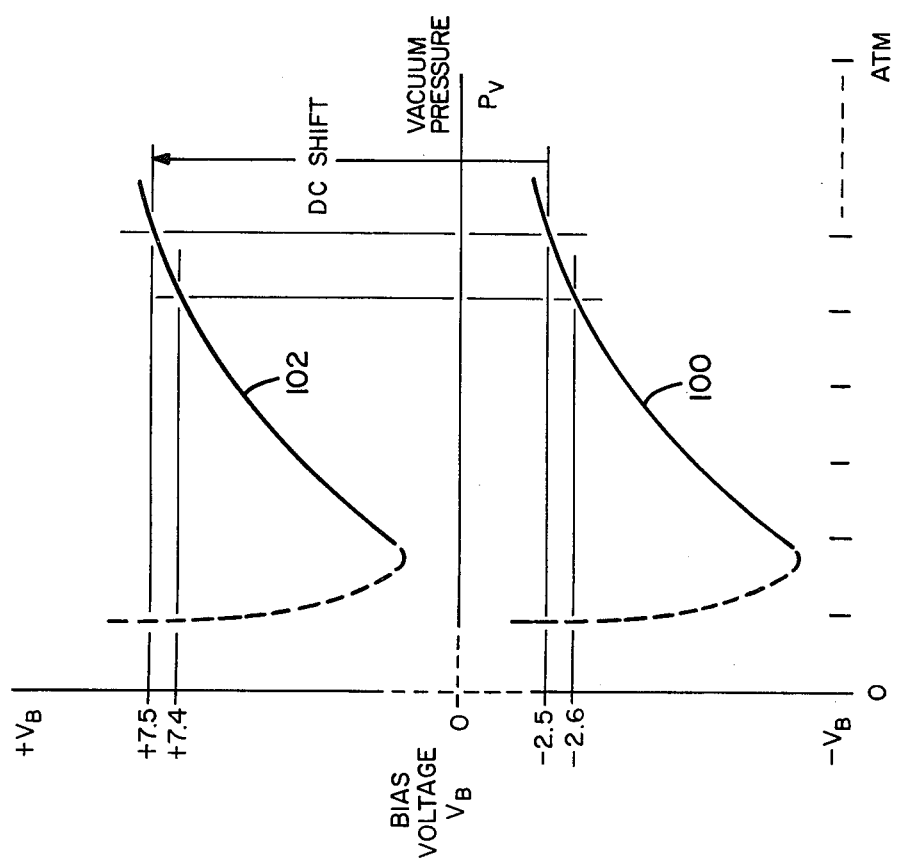
FIG. 3 are plots of the shifted and non-shifted bias voltage vs. vacuum pressure characteristics of the RF sputtering apparatus of FIG. 1.

As an example of the above, there are provided in FIG. 3 plots of the shifted and non-shifted bias voltage vs. vacuum pressure characteristics of the RF sputtering apparatus of FIG. 1. For a given setting of the variable capacitor 64 of substrate tuning bias circuit 46 there is determined a DC bias voltage vs. vacuum pressure characteristic plotted as curve 100 of FIG. 3. This non-shifted DC bias voltage curve 100, at node 74 of substrate tuning bias circuit 46, is then subjected to a positive DC shift by means of resistor 82 and voltage source 88 whereby the shifted bias voltage $V_{B2}$ is produced at node 80 and is, in turn, coupled to vacuum pressure controller 50. Vacuum pressure controller 50 is a commercially available product, such as that purchased from the Granville Phillips Corporation, Series 213 Automatic Pressure Controller, Model 01. Vacuum pressure controller 50, from the absolute, instantaneous value of the input signal of DC bias voltage $V_{B2}$ and a predetermined, internal reference signal setting, which reference signal setting is representative of a predetermined desired DC bias voltage $V_{B2}$ and the corresponding desired vacuum pressure $P_V$, processes a change in the input signal relative to the reference signal setting through a negative feedback amplifier. This processing of the change in the input signal couples the required output signal to gas source 18 which, in turn, stabilizes the vacuum pressure within evacuable enclosure 24 back at the desired vacuum pressure $P_V$. Knowing that within evacuable enclosure 24 an increase in vacuum pressure $P_V$ produces a predetermined increase in bias voltage $V_B$ and that correspondingly a decrease in vacuum pressure $P_V$ produces a predetermined decrease in bias voltage $V_B$, vacuum pressure controller 50 is coupled into the circuit schematic of FIG. 2 such that an increased bias voltage $V_B$ at node 60 produces an increased DC shifted bias voltage $V_{B2}$ at node 80. This increased DC shifted bias voltage $V_{B2}$ causes gas source 18 to decrease the flow of the inert gas into evacuable enclosure 24 such that a corresponding decrease in the vacuum pressure and bias voltage are achieved. Accordingly, this closed system causes a feedback from the bias voltage $V_B$ to the vacuum pressure $P_V$ such that the bias voltage is stabilized at a predetermined level by the controlled vacuum pressure.

As an example of the above, assume that the desired DC bias voltage $V_B$ at node 60 and node 66 is −25.0 volts such that the voltage divider network of resistors 70 and 72 of bias shifting circuit 48 provides at node 74 a DC bias voltage $V_{B1}$ of −2.50 volts. This is as illustrated with respect to curve 100 of FIG. 3. Next, assume that the resistor 82 and the voltage source 88 are selected such that a DC shift of +10.0 volts is achieved by bias shifting circuit 48 to provide at node 80 a shifted DC bias voltage $V_{B2}$ of +7.5 volts. This condition is the assumed desired operating condition of the RF sputtering apparatus of FIG. 1. Next, assume that the desired DC bias voltage $V_B$ of −25.0 volts at node 60 is decreased 1.0 volt to −26.0 volts, i.e., a 0.1 volt decrease of $V_{B2}$ to +7.4 volts at node 80. This decrease in the DC bias voltage $V_{B2}$ at node 80 effects vacuum pressure controller 50 to couple to gas source 18 an output signal that causes a corresponding increase in vacuum pressure $P_V$. Gas source 18, because of the decrease in the DC bias voltage $V_{B2}$, increases the flow of the inert gas into evacuable enclosure 24. This increased flow of the inert gas into evacuable enclosure 24 produces a corresponding increase of the DC bias voltage $V_B$, as determined at node 60, which increasing DC bias voltage $V_B$ by the reverse process described above, causes gas source 18 to increase the vacuum pressure within evacuable enclosure 24 such that the DC bias voltage $V_B$ is stabilized back at the predetermined desired DC bias voltage $V_B$ level of , e.g., −25.0 volts.

What is claimed is:

1. In an RF sputtering apparatus in which a thin film is to be deposited upon a substrate that is supported by a substrate holder in a spaced relationship with a cathodic target, a method of maintaining the DC bias voltage of said substrate holder at a constant predetermined level comprising:
    coupling an RF signal to the target of said RF sputtering apparatus;
    generating an effective DC bias voltage at the substrate holder of said RF sputtering apparatus;
    generating a predetermined DC shift of said DC bias voltage;
    coupling a vacuum pressure modifying means to said shifted DC bias voltage for modifying the vacuum pressure within said RF sputtering apparatus in response to said shifted DC bias voltage whereby said DC bias voltage is maintained constant in accordance with a predetermined bias voltage vs. vacuum pressure characteristic of said RF sputtering apparatus.

2. In an RF sputtering apparatus in which a thin film is to be deposited upon a substrate that is supported by a substrate holder in a spaced relationship with a cathodic target, a method of maintaining the DC bias voltage of said substrate holder at a constant predetermined level comprising:
    coupling an RF signal to the target of said RF sputtering apparatus;
    coupling a substrate tuning bias circuit to the substrate holder of said RF sputtering apparatus for generating an effective DC bias voltage that is established by the RF impedance of said substrate holder to ground potential;
    coupling a DC bias voltage shift circuit to said substrate tuning bias circuit for generating a predetermined DC shift of said DC bias voltage;
    coupling a source of an inert gas to said RF sputtering apparatus; and,
    coupling a vacuum pressure controller to said inert gas source and to said DC bias voltage shift circuit for adjusting the vacuum pressure within said RF sputtering apparatus in response to said shifted DC bias voltage and controlling said DC bias voltage to remain constant in accordance with the predetermined bias voltage vs. vacuum pressure characteristic of said RF sputtering apparatus.

3. A method of controlling the deposition of a thin film upon a substrate in an RF sputtering apparatus, comprising:
   coupling an RF signal to the target of said RF sputtering apparatus;
   coupling a substrate tuning bias circuit to the substrate holder of said RF sputtering apparatus for generating a DC bias voltage that has a predetermined bias voltage vs. vacuum pressure characteristic for said RF sputtering apparatus;
   coupling a DC bias voltage shift circuit to said substrate tuning bias circuit for generating a predetermined DC shift of said DC bias voltage;
   coupling a source of an inert gas to said RF sputtering apparatus; and,
   coupling a vacuum pressure controller to said inert gas source and to said DC bias voltage shift circuit for adjusting the vacuum pressure within said RF sputtering apparatus in response to said shifted DC bias voltage and controlling said DC bias voltage to remain constant in accordance with said predetermined bias voltage vs. vacuum pressure characteristic.

4. In an RF sputtering apparatus in which a thin film is to be deposited upon a substrate that is supported by a substrate holder in a spaced relationship with a cathodic target, an apparatus for maintaining the DC bias voltage of said substrate holder at a constant predetermined level comprising:
   RF signal source means for coupling an RF signal to the target of said RF sputtering apparatus;
   a substrate holder; means coupled to said substrate holder of said RF sputtering apparatus for generating a DC bias voltage that has a predetermined bias voltage vs. vacuum pressure characteristic for said RF sputtering apparatus;
   means coupled to said DC bias voltage generating means for generating a predetermined DC shift of said DC bias voltage;
   vacuum pressure modifying means coupled to said RF sputtering apparatus and to said DC bias voltage shift generating means for modifying the vacuum pressure within said RF sputtering apparatus in response to said shifted DC bias voltage and controlling said DC bias voltage to remain constant in accordance with said predetermined bias voltage vs. vacuum pressure characteristic.

5. In an RF sputtering apparatus in which a thin film is to be deposited upon a substrate that is supported by a substrate holder in a spaced relationship with a cathodic target, an apparatus for maintaining the DC bias voltage of said substrate holder at a constant predetermined level comprising:
   RF signal source means for coupling an RF signal to the target of said RF sputtering apparatus;
   a substrate holder a substrate tuning bias circuit means;
   means coupling said substrate tuning bias circuit means to said substrate holder of said RF sputtering apparatus for generating a DC bias voltage that has a predetermined bias voltage vs. vacuum pressure characteristic for said RF sputtering apparatus;
   a DC bias voltage shift circuit means;
   means coupling said DC bias voltage shift circuit means to said substrate tuning bias circuit means for generating a predetermined DC shift of said DC bias voltage;
   a source of an inert gas;
   means coupling said source of an inert gas to said RF sputtering apparatus;
   a vacuum pressure controller means; and,
   means coupling said vacuum pressure controller means to said inert gas source and to said DC bias voltage shift circuit means for adjusting the vacuum pressure within said RF sputtering apparatus in response to said shifted DC bias voltage for controlling said DC bias voltage to remain constant in accordance with said predetermined bias voltage vs. vacuum pressure characteristic.

6. In an RF sputtering apparatus in which a thin film is to be deposited upon a substrate that is supported by a substrate holder in a spaced relationship with a cathodic target, an apparatus for maintaining the DC bias voltage of said substrate holder at a constant predetermined level comprising:
   Rf signal source means for coupling an RF signal to the target of said RF sputtering apparatus;
   a substrate holder a substrate tuning bias circuit means coupled to said substrate holder of said RF sputtering apparatus for generating an effective DC bias voltage that has a predetermined bias voltage vs. vacuum pressure characteristic for said RF sputtering apparatus;
   a voltage divider network means coupled to said substrate tuning bias circuit means for generating a reduced bias voltage that has an amplitude that is a predetermined reduced ratio of the amplitude of said DC bias voltage;
   a DC voltage shift circuit means coupled to said voltage divider network means for generating a predetermined DC shift of said reduced bias voltage;
   a source of an inert gas coupled to said RF sputtering apparatus;
   a vacuum pressure controller means coupled to said inert gas source and to said DC voltage shift circuit means for adjusting the vacuum pressure within said RF sputtering apparatus in response to said shifted, reduced bias voltage and controlling said DC bias voltage to remain constant in accordance with said predetermined bias voltage vs. vacuum pressure characteristic.

7. An apparatus for controlling the deposition of a thin film upon a substrate in an RF sputtering apparatus, comprising:
   RF signal source means for coupling an RF signal to the target of said RF sputtering apparatus;
   a substrate holder a substrate tuning bias circuit means;
   means coupling said substrate tuning bias circuit means to said substrate holder of said RF sputtering apparatus for generating an effective DC bias voltage that has a predetermined bias voltage vs. vacuum pressure characteristic for said RF sputtering apparatus;
   a DC bias voltage shift circuit means;
   means coupling said DC bias voltage shift circuit means to said substrate tuning bias circuit means for generating a predetermined DC shift of said DC bias voltage;
   a source of an inert gas;

means coupling said source of an inert gas to said RF sputtering apparatus;

a vacuum pressure controller means; and, means coupling said vacuum pressure controller means to said inert gas source and to said DC bias voltage shift circuit means for adjusting the vacuum pressure within said RF sputtering apparatus in response to said shifted DC bias voltage and controlling said DC bias voltage to remain constant in accordance with said predetermined bias voltage vs. vacuum pressure characteristic.

8. An apparatus for controlling the deposition of a thin film upon a substrate in an RF sputtering apparatus, comprising:

RF signal source means for coupling an RF signal to the target of said RF sputtering apparatus;

a substrate holder a substrate tuning bias circuit means comprised of serially coupled inductor means and variable condenser means directly coupled at a first end to a source of ground potential;

means coupling the second end of said substrate tuning bias circuit means to said substrate holder of said RF sputtering apparatus for generating a DC bias voltage that has a predetermined bias voltage vs. vacuum pressure characteristic for said RF sputtering apparatus;

a voltage divider network means coupled to said substrate tuning bias circuit means for generating a reduced bias voltage that has an amplitude that is a predetermined reduced ratio or the amplitude of said DC bias voltage;

a DC voltage shift circuit means coupled to said voltage divider network means for generating a predetermined DC shift of said reduced bias voltage;

a source of an inert gas coupled to said RF sputtering apparatus;

a vacuum pressure controller means coupled to said inert gas source and to said DC voltage shift circuit means for adjusting the vacuum pressure within said RF sputtering apparatus in response to said shifted, reduced bias voltage and controlling said DC bias voltage to remain constant in accordance with said predetermined bias voltage vs. vacuum pressure characteristic.

* * * * *

UNITED STATES PATENT AND TRADEMARK OFFICE
CERTIFICATE OF CORRECTION

PATENT NO. : 4,043,889
DATED : August 23, 1977
INVENTOR(S) : LeRoy Joseph Kochel It is certified that error appears in the above-identified patent and that said Letters Patent are hereby corrected as shown below:

Column 5, Lines 37 and 61;
Column 6, Lines 25 and 55;
Column 7, Line 17,

"a substrate holder;" should be a separate paragraph, and the words following on each line should be the beginning of a new, separate paragraph.

Column 6, Line 13, "for" should be -- and --.

Column 6, Line 23, "Rf" should be -- RF --.

Column 8, Line 8, "or" should be -- of --.

Signed and Sealed this

Twenty-second Day of November 1977

[SEAL]

Attest:

RUTH C. MASON
Attesting Officer

LUTRELLE F. PARKER
Acting Commissioner of Patents and Trademarks